(12) United States Patent
Glenn

(10) Patent No.: US 11,299,642 B2
(45) Date of Patent: Apr. 12, 2022

(54) SYSTEMS AND METHODS OF ADDITIVE PRINTING OF FUNCTIONAL ELECTRONIC CIRCUITS

(71) Applicant: MORNINGBIRD MEDIA CORPORATION, Madison, AL (US)

(72) Inventor: Chance M. Glenn, Madison, AL (US)

(73) Assignee: MORNINGBIRD MEDIA CORPORATION, Madison, AL (US)

( * ) Notice: Subject to any disclaimer, the term of this patent is extended or adjusted under 35 U.S.C. 154(b) by 603 days.

(21) Appl. No.: 16/133,356

(22) Filed: Sep. 17, 2018

(65) Prior Publication Data

US 2019/0119516 A1   Apr. 25, 2019

Related U.S. Application Data

(60) Provisional application No. 62/559,795, filed on Sep. 18, 2017.

(51) Int. Cl.

| | | |
|---|---|---|
| C08F 2/46 | (2006.01) | |
| C08G 61/04 | (2006.01) | |
| C09D 11/104 | (2014.01) | |
| C09D 11/101 | (2014.01) | |
| C09D 11/102 | (2014.01) | |
| C09D 11/037 | (2014.01) | |
| C09D 11/52 | (2014.01) | |
| H01B 3/42 | (2006.01) | |
| H01B 1/24 | (2006.01) | |
| H01C 17/065 | (2006.01) | |
| H01G 4/33 | (2006.01) | |
| H01L 21/02 | (2006.01) | |
| H05K 3/12 | (2006.01) | |
| H01G 4/12 | (2006.01) | |
| B29C 64/118 | (2017.01) | |
| B29C 64/291 | (2017.01) | |
| B29B 11/10 | (2006.01) | |
| B33Y 10/00 | (2015.01) | |
| B33Y 70/00 | (2020.01) | |
| C09D 11/02 | (2014.01) | |
| C09D 11/322 | (2014.01) | |
| B29K 67/00 | (2006.01) | |
| B29K 63/00 | (2006.01) | |
| B29K 105/16 | (2006.01) | |
| B29K 505/14 | (2006.01) | |

(52) U.S. Cl.
CPC ............ *C09D 11/104* (2013.01); *B29B 11/10* (2013.01); *B29C 64/118* (2017.08); *B29C 64/291* (2017.08); *B33Y 10/00* (2014.12); *B33Y 70/00* (2014.12); *C09D 11/02* (2013.01); *C09D 11/037* (2013.01); *C09D 11/101* (2013.01); *C09D 11/102* (2013.01); *C09D 11/322* (2013.01); *C09D 11/52* (2013.01); *H01B 1/24* (2013.01); *H01B 3/421* (2013.01); *H01C 17/0652* (2013.01); *H01C 17/06586* (2013.01); *H01G 4/1218* (2013.01); *H01G 4/33* (2013.01); *H01L 21/02422* (2013.01); *H01L 21/02532* (2013.01); *H01L 21/02623* (2013.01); *H01L 21/02664* (2013.01); *H05K 3/1283* (2013.01); *B29K 2063/00* (2013.01); *B29K 2067/046* (2013.01); *B29K 2105/162* (2013.01); *B29K 2505/14* (2013.01); *H01L 21/02527* (2013.01); *H01L 21/02601* (2013.01); *H01L 21/02628* (2013.01)

(58) Field of Classification Search
CPC ... C09D 11/104; C09D 11/102; C09D 11/322; C09D 11/037; C09D 11/02; C09D 11/52; C09D 11/101; H01C 17/06586; H01C 17/0652; H01B 1/24; H01B 3/421; H01L 21/02623; H01L 21/02422; H01L 21/02664; H01L 21/02532; H01L 21/2601; H01L 21/02628; H01L 21/02527; H05K 3/1283; H01G 4/33; H01G 4/1218; B29B 11/10; B33Y 70/00; B33Y 10/00; B29C 64/118; B29C 64/291; B29K 2105/162; B29K 2505/14; B29K 2063/00; B29K 2067/046
USPC .................................................. 522/1; 520/1
See application file for complete search history.

(56) References Cited

FOREIGN PATENT DOCUMENTS

| CN | 105965881 | * | 9/2016 |
|---|---|---|---|
| CN | 106903305 | * | 6/2017 |

OTHER PUBLICATIONS

Okamoto et al, CN 105965881 Machine Translation, Sep. 28, 2016 (Year: 2016).*
Gao et al, CN 106903305 Machine Translation, Jun. 30, 2017 (Year: 2017).*

* cited by examiner

*Primary Examiner* — Jessica Whiteley
(74) *Attorney, Agent, or Firm* — Buchanan Ingersoll & Rooney PC

(57) ABSTRACT

A composition, method, and system for directly printing and creating complete functional 3D electronic circuits and devices without any thermal or laser post-processing treatment, by using at least Triphenylamine (TPA) as a powder binding agent. The composition can have mechanical characteristics that allow it to be melted and extruded on a structure, and electrical properties that allow it to function as at least one of a conductor, insulator, resistor, p-type semiconductor, n-type semiconductor, or capacitor.

5 Claims, 25 Drawing Sheets

SYSTEMS AND METHODS OF ADDITIVE PRINTING OF FUNCTIONAL ELECTRONIC CIRCUITS

CROSS-REFERENCE TO RELATED APPLICATIONS

This application claims priority to U.S. Provisional Application No. 62/559,795 filed on Sep. 18, 2017, the entire content of which is incorporated herein by reference.

STATEMENT REGARDING FEDERALLY SPONSORED RESEARCH OR DEVELOPMENT

This invention was made with government support under contract NNX16CM40P awarded by the National Air & Space Administration (NASA). The government may have certain rights in the invention.

FIELD

The present disclosure relates to additive systems and methods of creating functional electronic circuits and circuit boards.

BACKGROUND INFORMATION 3D printing is any of various processes in which a material is joined or solidified under computer control to create a three-dimensional object, with the material being added together (such as liquid molecules or powder grains being fused together). 3D printing can be used in both rapid prototyping and additive manufacturing. Objects typically are produced using digital model data from a 3D model or another electronic data source such as an Additive Manufacturing File (AMF).

Additive manufacturing is becoming a leading method for reducing costs, increasing quality, and shortening schedules for production of innovative parts and components that were previously not possible using more traditional methods of manufacturing. Known additive manufacturing technologies are based on computer-controlled layer-by-layer building of the parts. Recent advances in 3D printing of electronic components combined this layer-by-layer printing technology with embedded interconnected and pre-fabricated electronic components to create a cost-efficient process for manufacturing electronic devices. As a result, the production of electronic devices is primarily a combination of an assembled 3D printing case and pre-manufactured individual circuit components.

3D printing electronics can involve "directly" writing an electronic circuit using an inkjet printing process. Known 3D printing processes for electronic devices are limited to planar only printing with possible adjustments in a third dimension (2.5 Dimensional printing). The development of aerosol jet printing technology provides advantages over current inkjet printing processes. Aerosol jet printing provides that fine feature electronic prints can be obtained by means of pneumatically or ultrasonically atomizing and transferring formulated inks to and through an aerodynamically focused jet nozzle to the substrate. The aerosol jet printing process uses proprietary inks to print small-scale electronics in three axis (x,y,z) with up to 10 microns single-pass layer thickness. This non-contact printing strategy allows for precise printing on non-conformal surfaces, down into trenches, and overtop of 3D electronic components with complex geometries. However, aerosol jet printing requires the post-processing oven or laser treatment of the printed product in order to remove the binder agents added to the materials.

Post processing techniques such as oven heating or laser treatment can adversely affect the electrical and mechanical properties of materials that have been formed by the additive manufacturing process. For example, post processing techniques using extreme heat can alter Young's modulus of the material. Electrical properties such as the IV (current-voltage) characteristics, the resistivity/conductivity, or the dielectric constant can be altered by excess heat. This can significantly impact the desired performance of an electrical or electronic circuit. Known polymer binding agents can include 100% Polylactide acetone solution (PLA) and 100% Acrylonitrile Butadiene Styrene (ABS) acetone solution. However, the materials printed using the known polymer binding agents can be brittle, and therefore unsuitable for 3D printing of electronic devices.

Semiconductor based electronic circuits can be created by doping a base layer of silicon with various dopants. The entire base layer (and the doped portions) is then overlaid with an insulator compound (typically silicon dioxide). The insulator compound is masked, and the unmasked portions of the insulator compound are removed. The entire surface is then covered with an electrically conductive material (e.g., aluminum or polysilicon) and selectively masked. Excess or undesired portions of the conductive material layer that are not masked are then removed. The insulator layer and metal (i.e., conductive material) layer may be repeated as necessary to build the desired electronic circuit.

The existing and most advanced technology of 3D printing of electronic components primarily combines the conventional layer-by-layer printing of conductors and insulators with embedded interconnected and pre-fabricated electronic components to create cost-efficient manufacturing of electronic devices in three dimensions. As a result, the productions of electronic devices are a combination a assembly of a 3D printing cavity along with highly conductive paste and pre-manufactured individual circuit components. The direct writing technologies available for the printing electronics include the inkjet, aerosol jet, or screen-printing. Although the 3D planar printing of electronic circuit devices can be accomplished using the jet or screen printing technologies, all technologies require the thermal or laser post-processing treatment.

Currently, there are no semiconductor ink materials that are available, which allow for direct 3D printing of semiconductor devices and hence there are no 3D printers which have such ink materials. Direct 3D printing involves the laying down of layers of material without additional treatment. These layers can combine to form a 3 dimensional structure as opposed to a 2 dimensional planar circuit.

Technology challenges in overcoming the above noted issues include (1) preparation of ink-based printing materials necessary for realizing the desired electrical properties for the 3D electronic devices; (2) deposition and process of the ink-based materials for 3D electronics, and (3) the complexity of computer aided design software control to produce a functional 3D electronic device. The present disclosure provides a direct answer to these key technology challenges.

SUMMARY

Exemplary embodiments of the present disclosure address the technology challenges in direct 3D printing by providing system, compositions, and processes for the direct printing and creation of complete functional 3D electronic circuits and devices without the need to undergo any thermal or laser post-processing treatment.

A composition for use in 3D printing of electronic devices is disclosed, the composition can comprise at least Triphenylamine (TPA). TPA can be used in a novel manner as a powder binding agent in the composition that is to be melted and extruded on a structure. These electronic devices can include one of or any combination of conductive, resistive, capacitive, semiconducting and insulating materials.

Exemplary embodiments of the present disclosure relate to systems and methods for creating electronic devices with steps that can be purely additive, eliminating the need for the masking and removal steps of the known circuit creation techniques. This can be accomplished via a three dimensional printer that can utilize various conductive and non-conductive materials to print the desired circuit onto a base layer such that no excess is laid down on the base, which would require masking and removal.

This technique for the 3D printing of functional electronics (3De) revolutionizes the way electronics are designed, produced, and implemented throughout numerous fields of technology. There are six fundamental materials that can be critical to the electronic circuits: conductive, capacitive, resistive, n-type semiconducting, p-type semiconducting, and insulating.

Exemplary embodiments of the present disclosure are also directed to a printer, refillable material cartridges, control software, design software, and a membership driven user development community portal. In general, the system can enable a user design, layout, and print various 3D electronic circuits in a multitude of form factors, thus providing on demand, customized, production that meets the specific need at the specific time. The exemplary system and methods can be used in a variety of applications, for example, to form sensors and biomedical detectors, to perform circuit layout and design and, insitu production, for use as educational and training tools and in research and development, toys, games, enhanced electronic components, replacement parts, communications devices, computing equipment, household electronic components, industrial electronic components, over land electronic components, aerospace electronic components, nautical electronic components, sports equipment, construction equipment, robotic equipment, networking devices, Wi-Fi devices, Bluetooth devices, decorative components, lighting equipment, audio equipment, satellite components, spacecraft components, devices that utilize artificial intelligence, mobile devices, military equipment, wearable technology, devices utilizing Blockchain technology, devices utilizing finance, banking, and monitory technology, electronic jewelry, electronic time-keeping devices, internet of things (IoT) devices, or in any other application or implementation as desired.

BRIEF DESCRIPTION OF THE DRAWINGS

Other objects and advantages of the present disclosure will become apparent to those skilled in the art upon reading the following detailed description of exemplary embodiments, in conjunction with the accompanying drawings, in which like reference numerals have been used to designate like elements, and in which.

DETAILED DESCRIPTION

Figure 1:
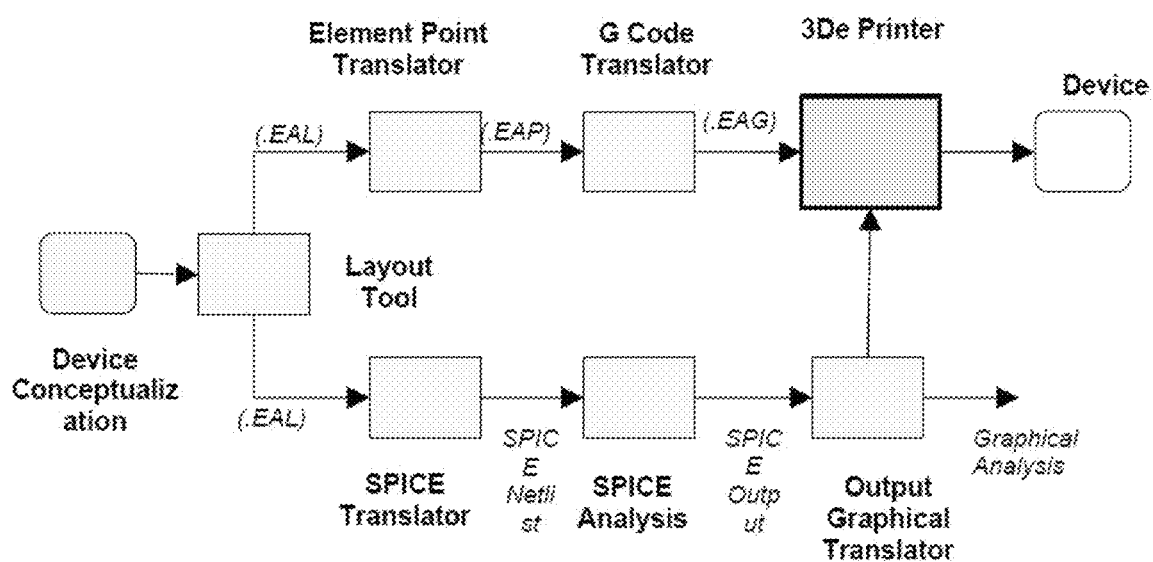
FIG. 1 illustrates a flow chart showing the steps of a method of 3D printing a functional electrical circuit according to an exemplary embodiment.
Figure 2A:
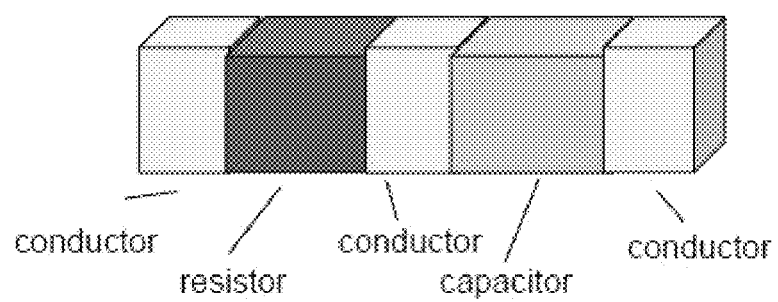
FIG. 2A illustrates an isometric view of a physical implementation of an electronic circuit according to an exemplary embodiment.
Figure 2B:
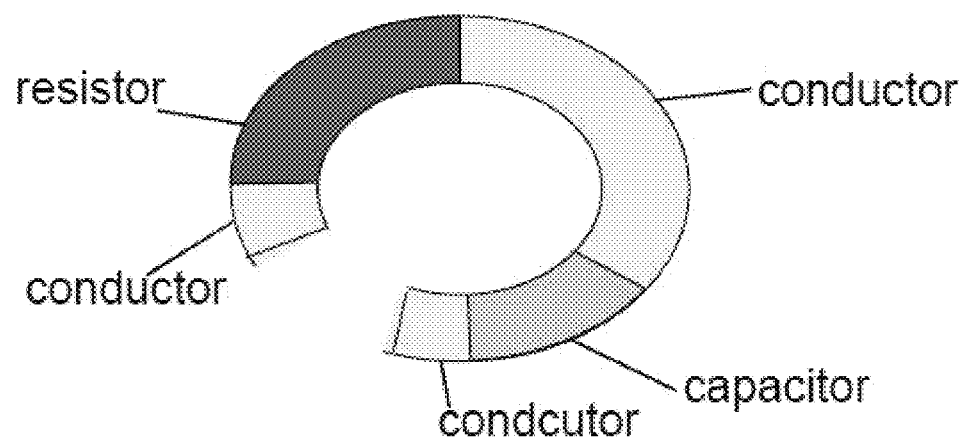
FIG. 2B illustrates an isometric view of a physical implementation of an electronic circuit according to an exemplary embodiment.
Figure 2C:
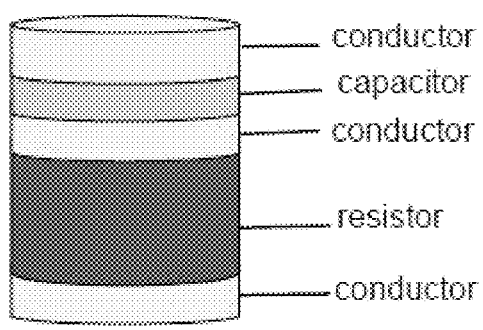
FIG. 2C illustrates an isometric view of a physical implementation of an electronic circuit according to an exemplary embodiment.
Figure 3A:
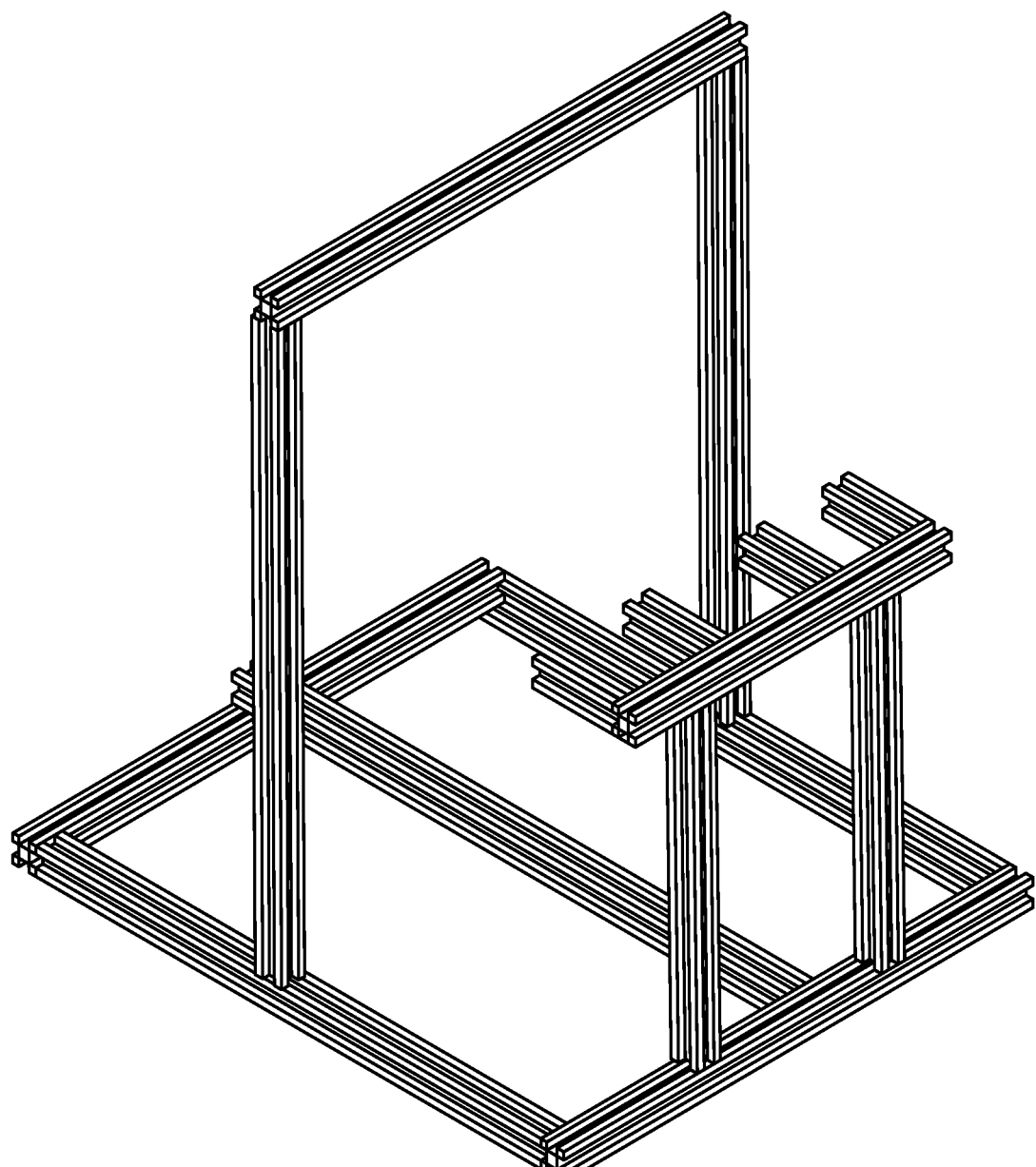
FIG. 3A illustrates an isometric view of a design drawing of a printer frame of a 3D printing device according to an exemplary embodiment.
Figure 3B:
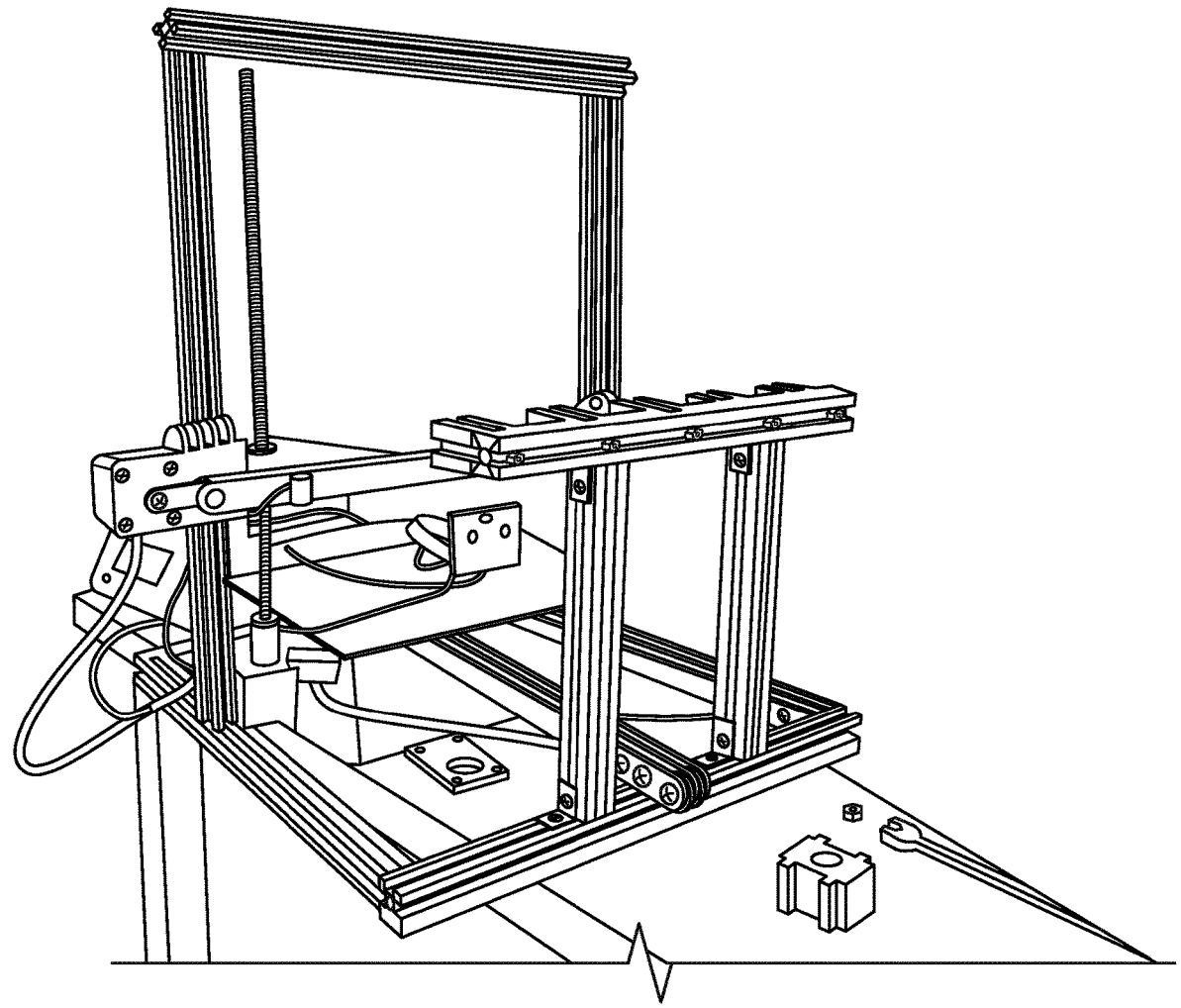
FIG. 3B illustrates an isometric view of a printer frame, a printer, and a three material carriage station for the printer of the 3D printing device according to an exemplary embodiment. The carriage station can be made to hold six or more materials for use by the printer. The material cartridges can be held in the stations and picked up or replaced by the printer arm as mandated by a driver software.
Figure 4A:
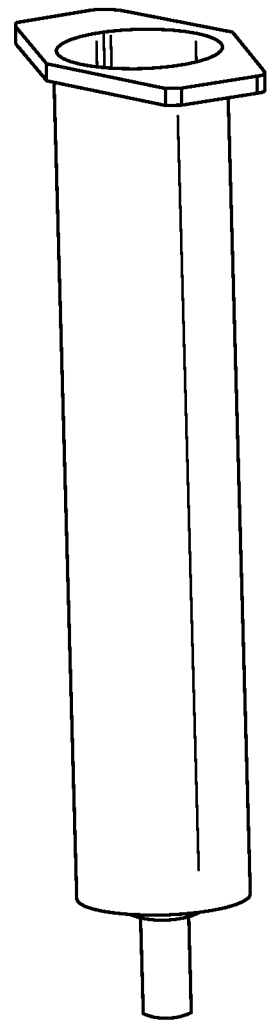
FIG. 4A illustrates an isometric view of a print cartridge according to an exemplary embodiment. The print cartridge can hold the materials and extrude them on the surface or base according to the coordinates dictated by the driver software required to build the structure outlined by, for example, a computer aided drafting (CAD) program.
Figure 4B:
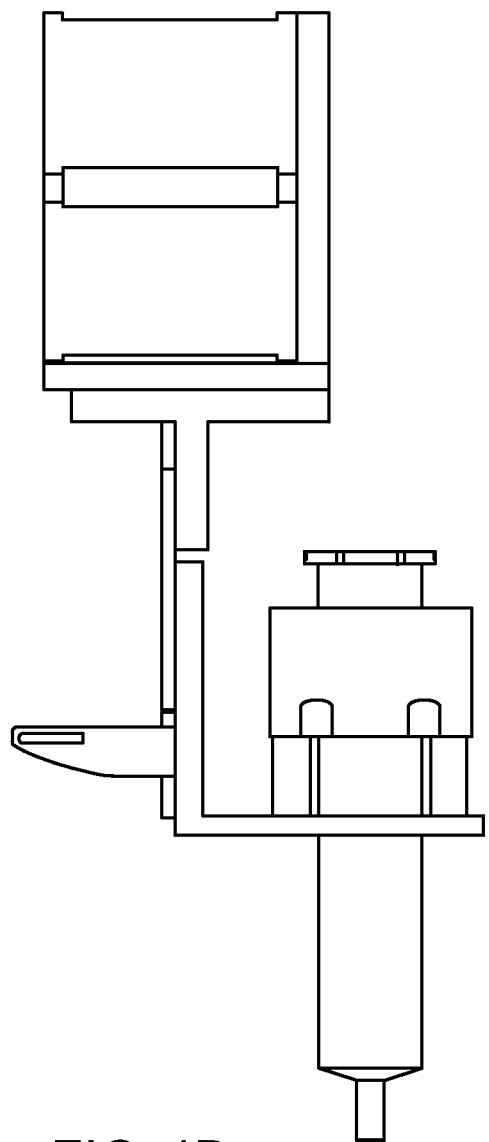
FIG. 4B illustrates a side plan view of a printer arm supporting the print cartridge of FIG. 4A according to an exemplary embodiment. The accuracy and resolution of the printer arm can depend in part by the cartridge tip size and opening dimensions. These dimensions can be modified to optimize the performance of the printer based on the materials used for printing.
Figure 4C:
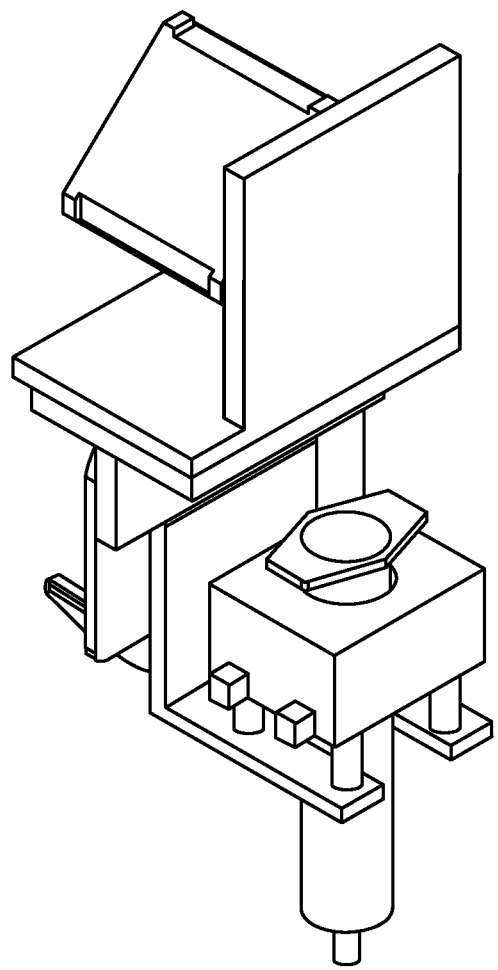
FIG. 4C illustrates a front plan view of the printer arm of FIG. 4B supporting the print cartridge of FIG. 4A according to an exemplary embodiment. The printer arm can move the tip of the carriage to the destination coordinates to extrude the desired material onto the structure
Figure 5A:
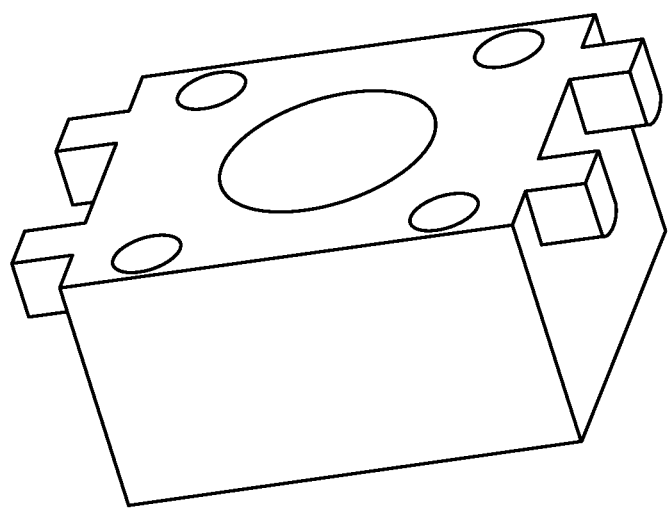
FIG. 5A illustrates an isometric view of a print cartridge insert according to an exemplary embodiment. The cartridge insert holds a cartridge for placement on the printer arm or in the multi-material carriage station.
Figure 5B:
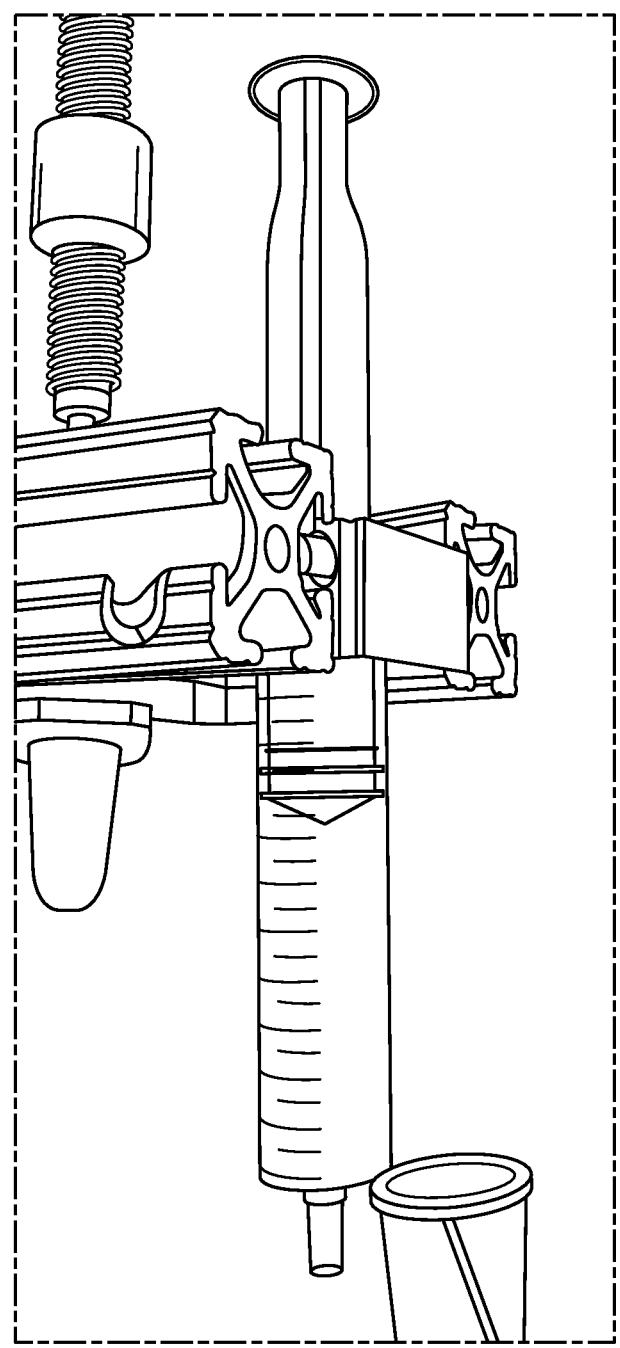
FIG. 5B illustrates an isometric view of the print cartridge insert of FIG. 5A supporting the print cartridge of FIG. 4A supported by the carriage station or frame according to an exemplary embodiment.
Figure 6:
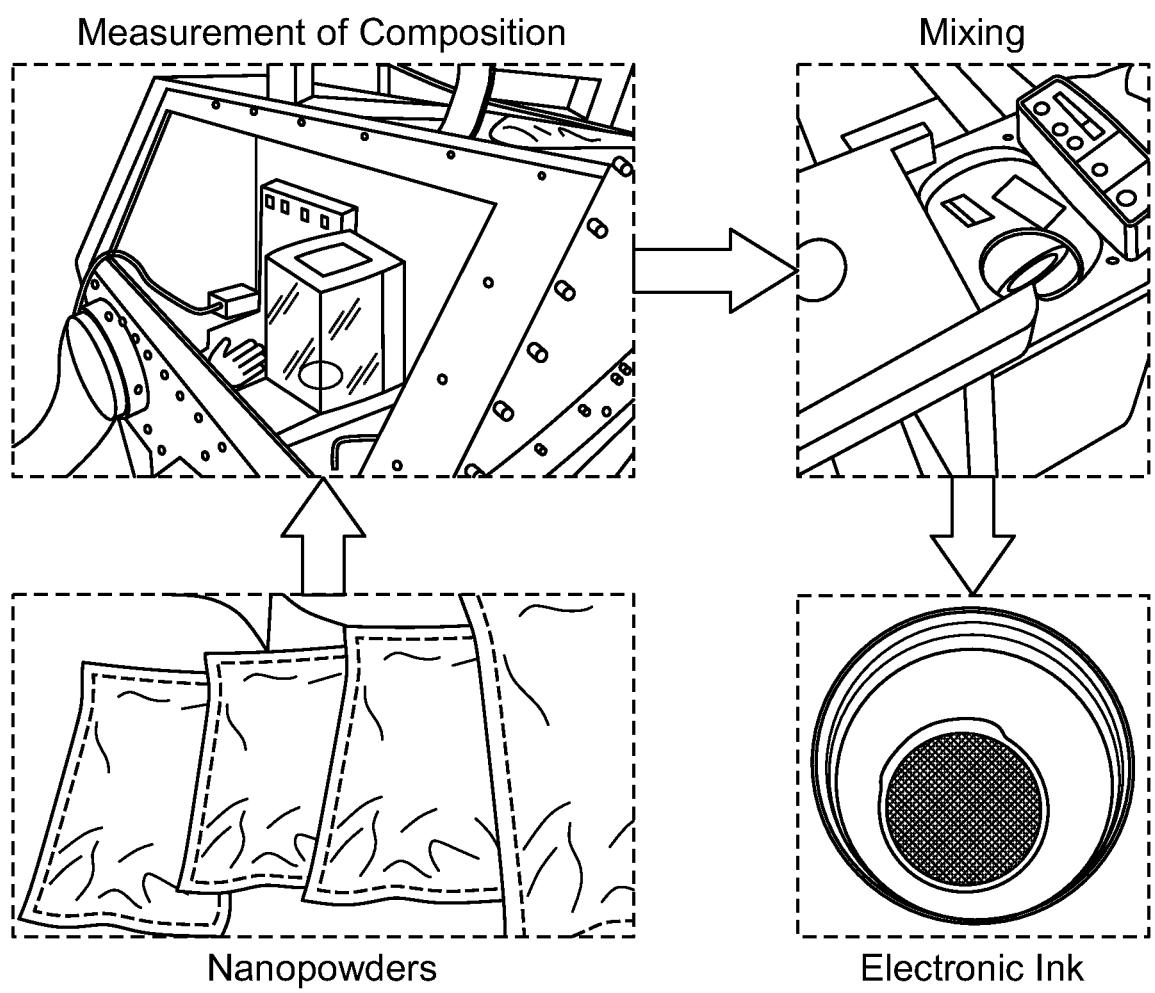
FIG. 6 illustrates one mixing procedure utilizing nanopowder in solution according to an exemplary embodiment. Bismuth nanopowders can be mixed with liquid epoxy to form the printing medium or electronic ink.
Figure 7A:
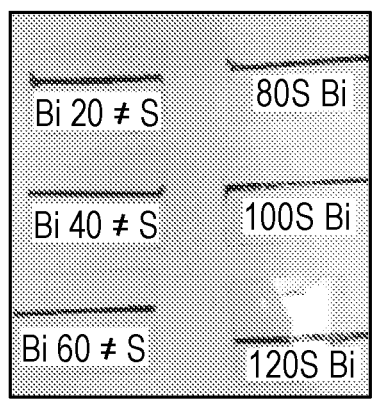
FIG. 7A illustrates ultraviolet (UV) cured semiconductor mixtures according to an exemplary embodiment.
Figure 7B:
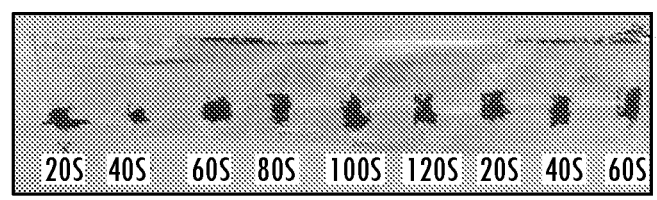
FIG. 7B illustrates ultraviolet (UV) cured semiconductor mixtures according to an exemplary embodiment.
Figure 8A:
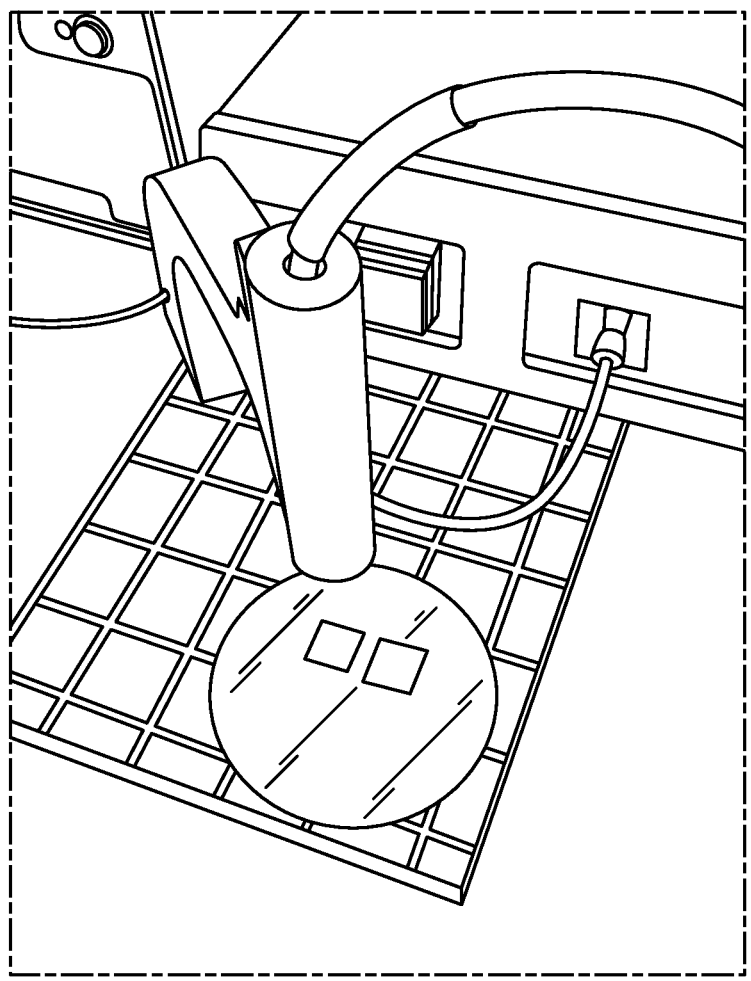
FIG. 8A illustrates TPA mixtures in various thicknesses for testing according to an exemplary embodiment.
Figure 8B:
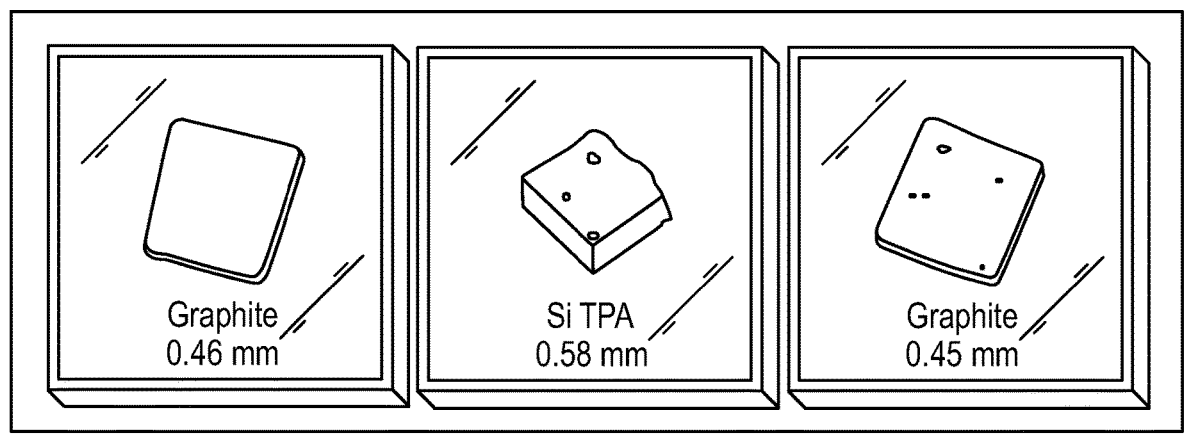
FIG. 8B illustrates ultraviolet testing of TPA mixtures according to an exemplary embodiment.
Figure 9:
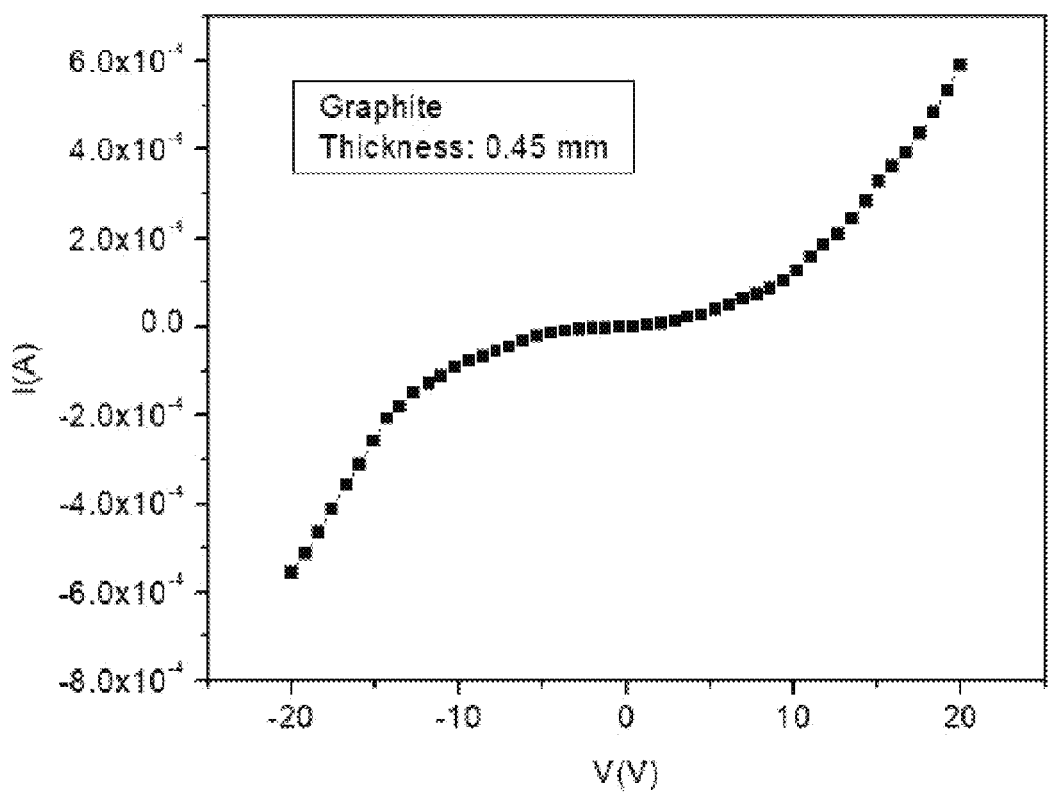
FIG. 9 shows a resistance curve for a cured graphite and TPA adhesive mixture according to an exemplary embodiment.
Figure 10:
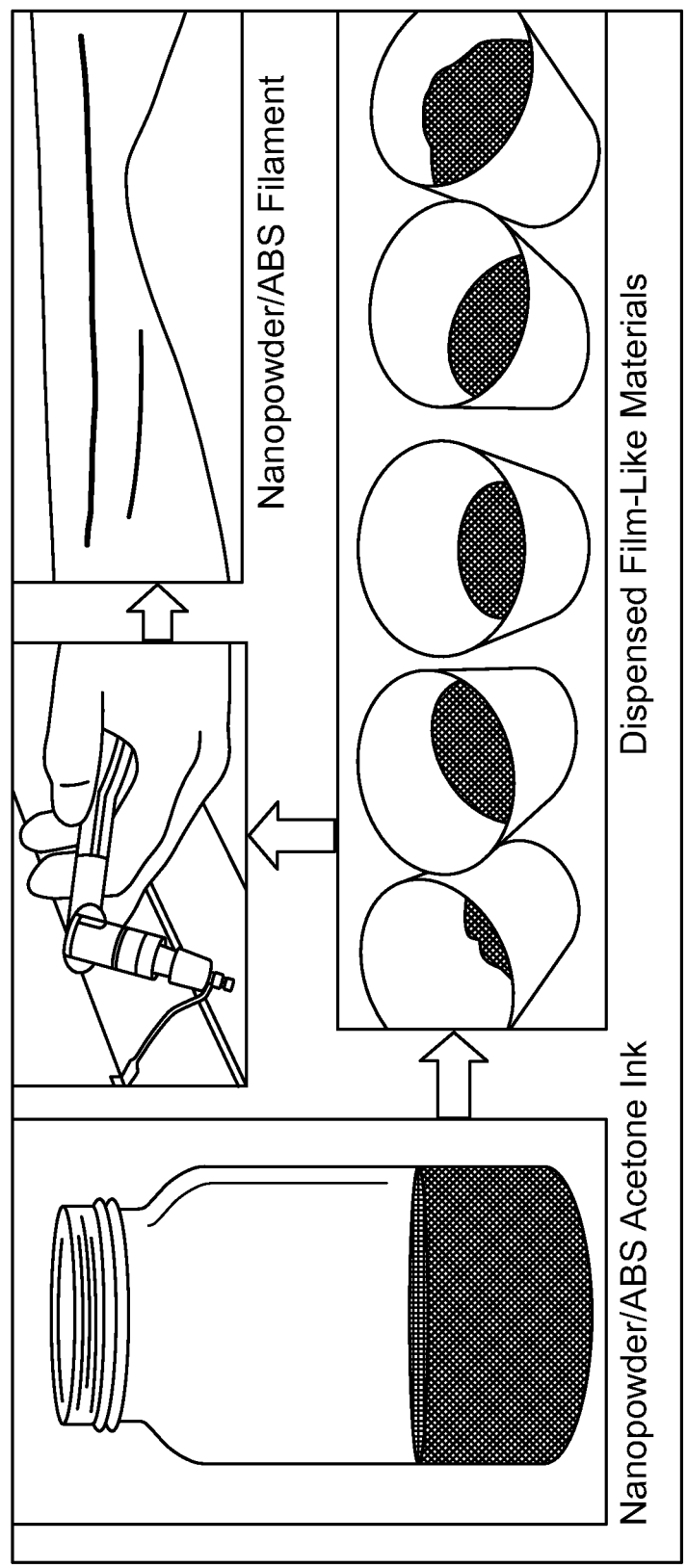
FIG. 10 shows mixing nanopowder and ABS-acetone to create printing media (i.e., electronic ink) according to an exemplary embodiment.
Figure 11:
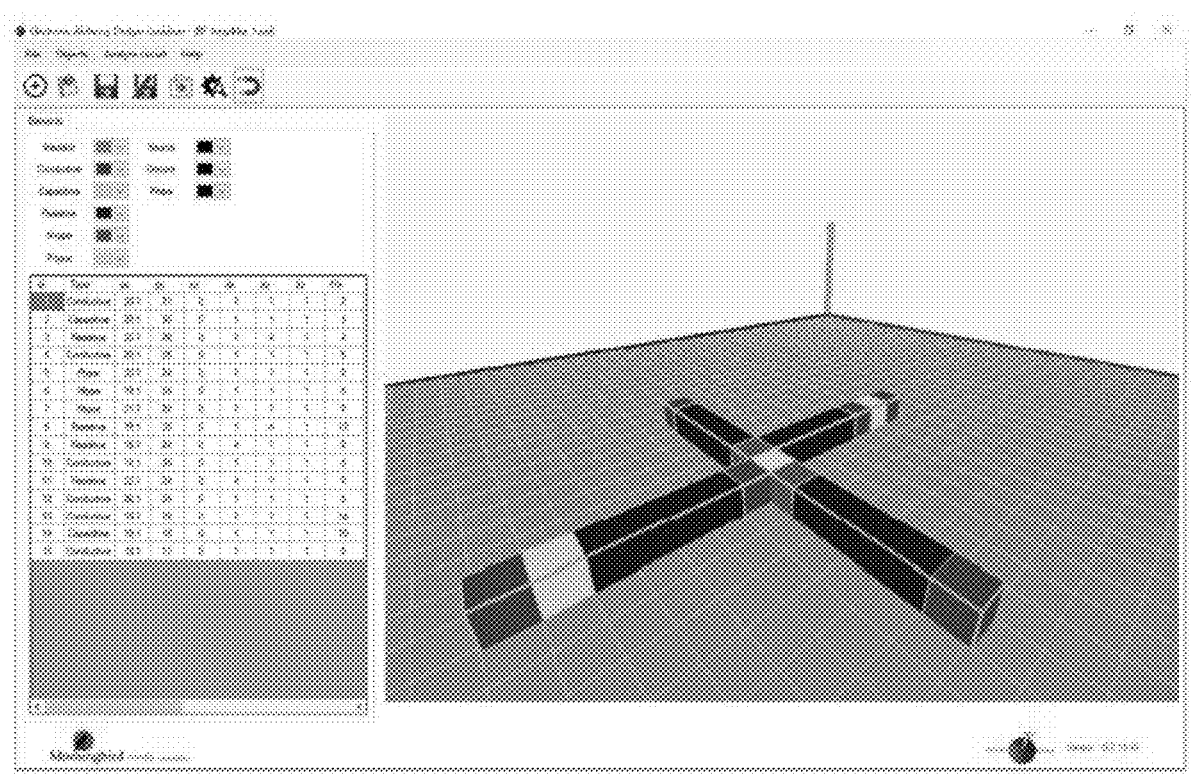
FIG. 11 shows an exemplary user interface of a 3D circuit design program according to an exemplary embodiment.
Figure 12:
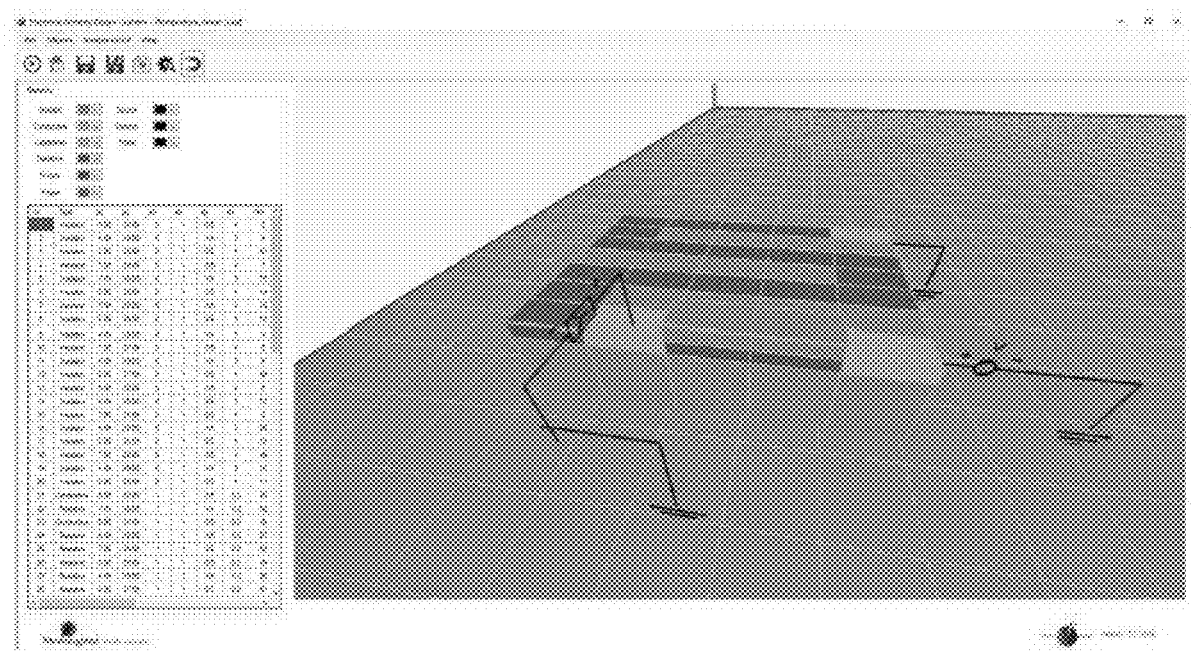
FIG. 12 shows an exemplary user interface of a 3D circuit design program depicting a temperature sensor according to an exemplary embodiment.
Figure 13:
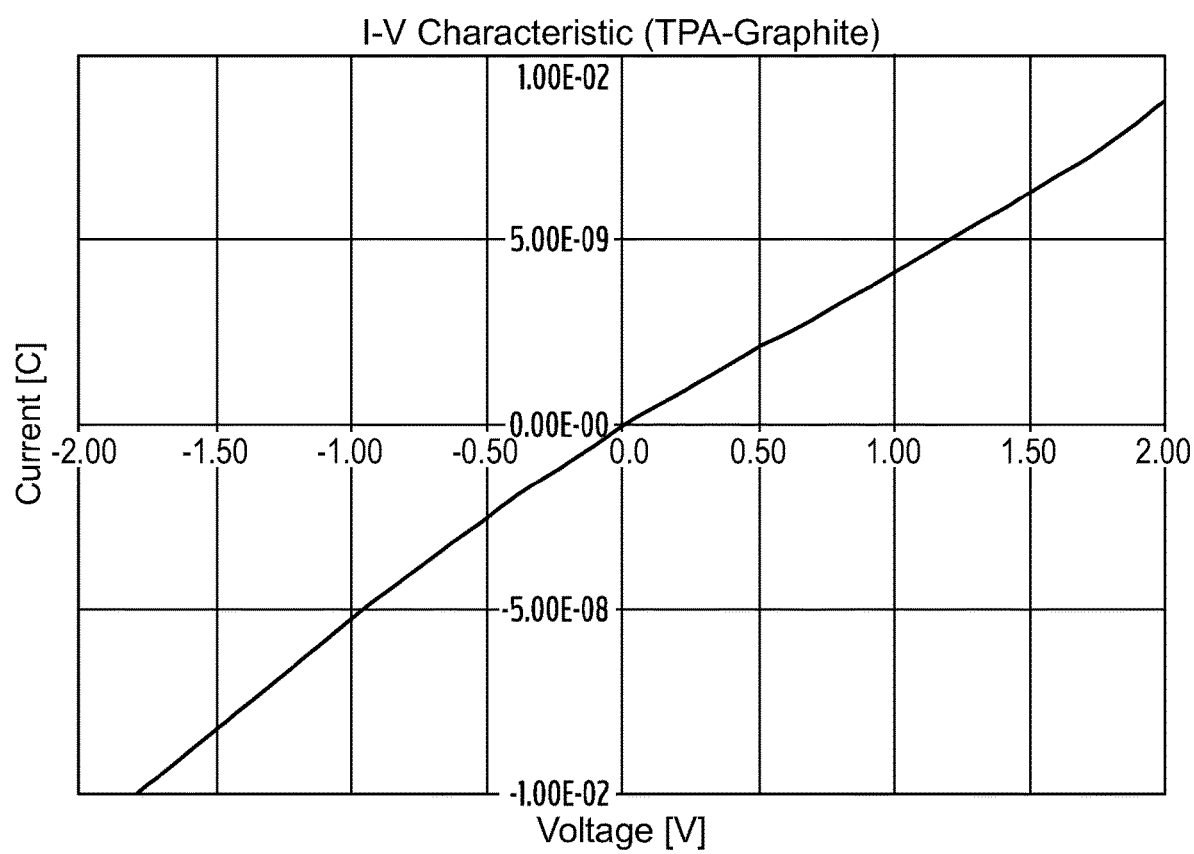
FIG. 13 shows a measured IV characteristic curve for a TPA-Graphite mixture showing a resistance of approximately 250 Ohms for a 2 mm length 0.4 mm diameter material sample.
Figure 14:
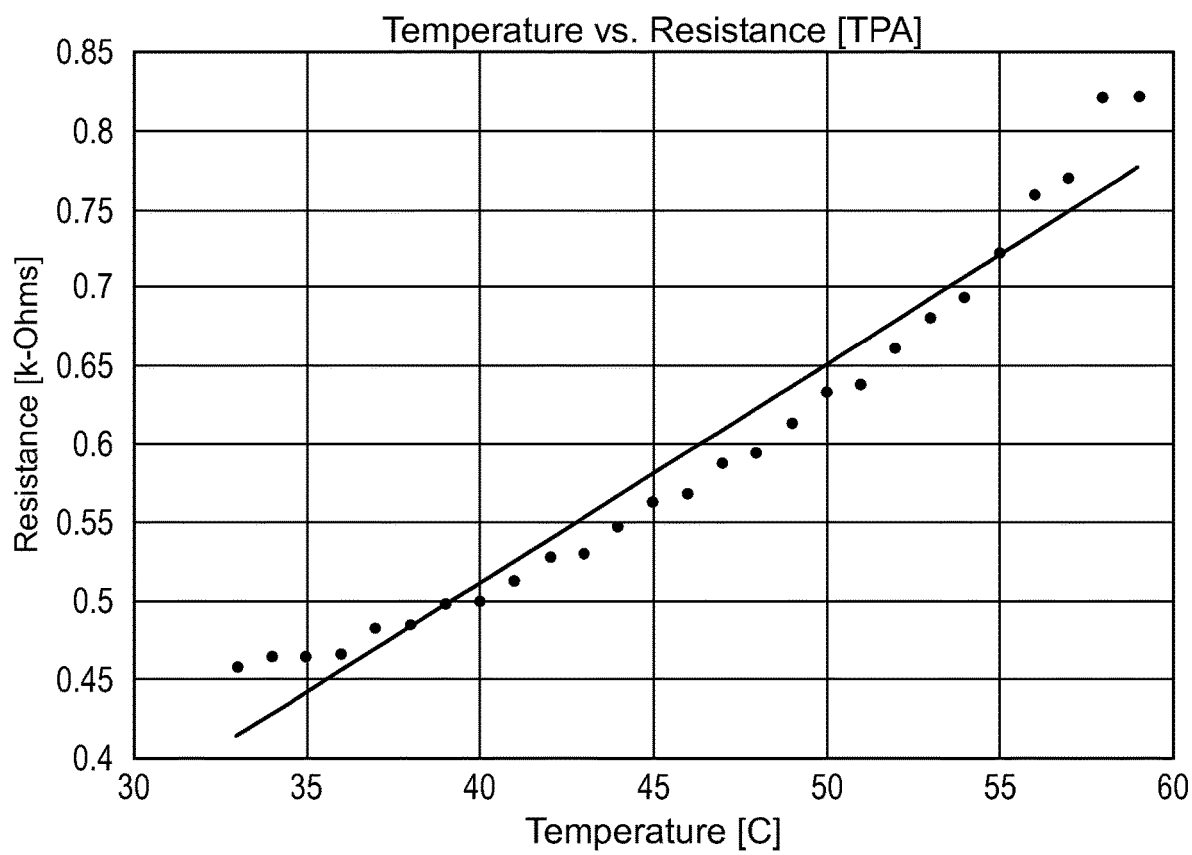
FIG. 14 illustrates a temperature vs resistance curve for 0.4 mm sample of TPA-Graphite mixture showing an accurate temperature sensing capability.
Figure 15:
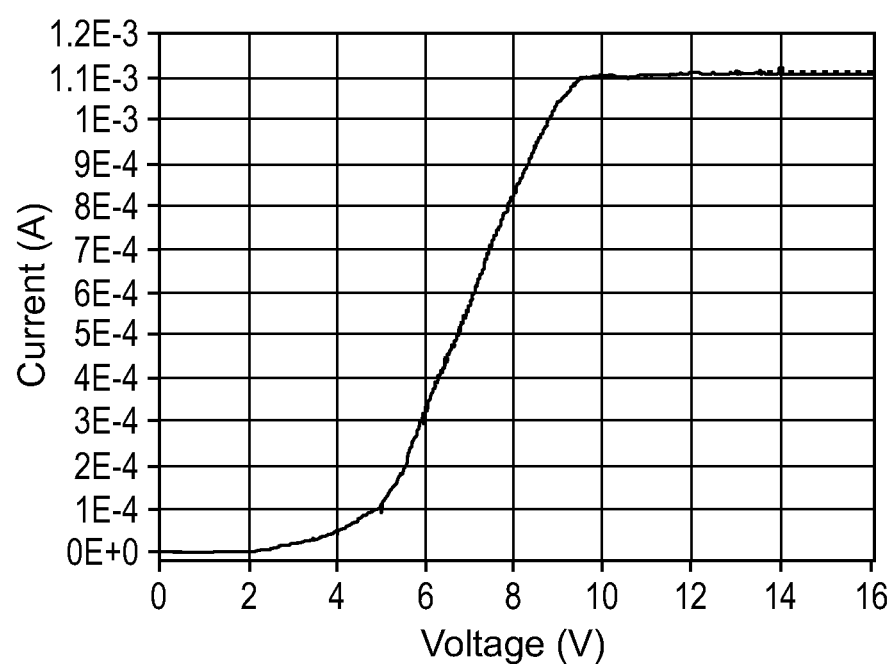
FIG. 15 shows a IV characteristic curve for a N-type TPA-Si mixture sample.
Figure 16:
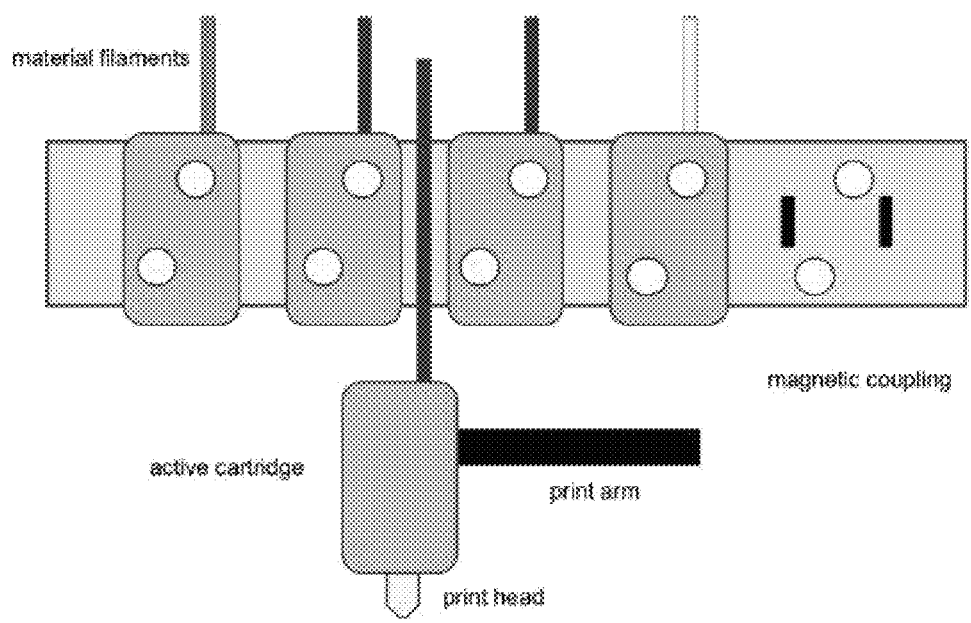
FIG. 16 shows a multi-material station using magnetic coupling and mechanical grips to attach and detach material filament cartridges to and from the print arm to the material holding arm.

An exemplary embodiment of the present disclosure is directed to systems and methods for directly printing and creating complete functional 3D electronic circuits and devices without the need to undergo any thermal or laser post-processing treatment. The systems and methods can use TPA as a powder binding agent. TPA, by itself, can be used as the powder binding agent in a composition for use in 3D printing of electronic devices, or it can be used in combination with other materials. The TPA can be mixed with one or more powders for 3D printing based on the desired electrical and mechanical properties of the composition, such that the composition can be melted and extruded onto a structure, while maintaining the desired electrical characteristics.

TPA, is a polymer compound having a lower melting point than that of Polylactide (PLA) and Acrylonitrile butadiene styrene (ABS). Further, at room temperature a state of TPA can be both pliable and malleable. When exposed to high temperature, the TPA material can melt into relatively high viscosity fluid. The viscosity of the melted TPA varies inversely with the temperature. TPA by itself or when combined with other materials is suitable to be used as a binder agent for 3D printing mixtures. Because of its flexibility, TPA crosses the threshold of the mechanical flexibility required so that a print can be made with a thermal material printer (standard) in conjunction with one or more powders necessary for achieving the desired electrical properties. This allows a composition with TPA to be melted and extruded on a structure without breaking. In contrast, 3D ink filaments with a composition that includes, for example, ABS mixed with nanopowders is brittle. Therefore, such filaments can easily break when extruded on a structure. Additionally, these ABS filaments do not allow for easy storage and transport because of their brittleness.

In 3D printing technology, filaments are fed into a printing nozzle to create the 3D object. The creation of a filament for a 3D printer has two main considerations: the electrical characteristics and the physical characteristics. A critical mixture ratio of powder to polymer is required for each filament so that the 3D printed electronic devices behave appropriately with respect to the desired electrical and physical characteristics. For example, a mixture of PLA and graphite powder in specific amounts can exhibit the properties of a resistor. Increasing the proportion of PLA in that mixture, however, can cause the resistance property to be lost. Increasing the proportion of graphite powder can make the mixture too brittle to be used as a filament.

By contrast, a mixture of TPA based polymer and graphite and/or other powder, with a higher proportion of the powders, can result in the unexpected property of being malleable enough to allow for various electrical characteristics while being flexible enough for filaments that will work in temperature based printer extruders.

An exemplary composition of the present disclosure can be made to exhibit any of a number of electrical properties as desired. For example, an exemplary composition can be formed of a mixture to exhibit insulating electrical characteristics that restricts or blocks the flow of current. An exemplary composition can also be formed to have conducting electrical characteristics that freely conduct electric current. An exemplary composition can be formed to have resistive-electrical characteristics that resist current flow but do not completely block the flow of current. An exemplary composition can be formed to have capacitive electrical characteristics that can store electrical charge. Further, an exemplary material can be formed to have semi-conducting electrical characteristics that can resist or conduct current dependent upon the voltage potential across it. The electrical characteristics described herein can be realized, enhanced, and/or diminished in a material based on the proportion of TPA and other components of the composition.

In an exemplary embodiment, the composition can be insulating when the TPA forms about 99% of the material by weight.

In an exemplary embodiment, the composition can be insulating when the TPA forms about 25% of the material by weight and PLA forms about 75% of the weight.

In an exemplary embodiment, the composition can be conducting when graphene forms at least about 5% of the composition by weight, and silver (Ag) forms at least about 15% of the composition by weight, such that the graphene and Ag can be in a powder form with particle size ranging from about 100 nm to about 100,000 nm.

In an exemplary embodiment, the composition can be resistive when graphite forms at least about 25% of the composition by weight, and silver (Ag) forms at least about 10% of the composition by weight, such that the graphite and Ag can be in a powder form with particle size ranging from about 100 nm to about 100,000 nm.

In an exemplary embodiment, the composition can be resistive when PLA forms at least about 25% of the composition by weight, graphite forms at least about 25% of the composition by weight, and silver (Ag) forms at least about 10% of the composition by weight, such that the graphite and Ag can be in a powder form with particle size ranging from about 100 nm to about 100,000 nm.

In an exemplary embodiment, the composition can be capacitive when Titanium dioxide (TiO2) forms at least about 35% of the composition by weight, such that the TiO2 can be in a powder form with particle size ranging from about 100 nm to about 100,000 nm.

In an exemplary embodiment, the composition can be capacitive when PLA forms at least about 30% of the composition by weight and Titanium dioxide (TiO2) forms at least about 35% of the composition by weight, such that the TiO2 is in a powder form with particle size ranging from about 100 nm to about 100,000 nm.

In an exemplary embodiment, the composition can be semiconducting, when silver (Ag) forms at least about 5% of the composition by weight, and n-type Silicon semiconductor (Si—N) forms at least about 50% of the composition by weight, such that the Si—N is in a wafer form with a particle size of about 100 um.

In an exemplary embodiment, the composition can be semiconducting, when silver (Ag) forms at least about 5% of the composition by weight, and p-type Silicon semiconductor (Si—P) forms at least about 50% of the composition by weight, such that the Si—P is in a wafer form with a particle size of about 100 um.

Semiconductor particle weight fraction can affect the electrical properties of a semiconductor ink-based material, and may vary in various aspects of the present disclosure. Semiconductor ink-based compositions can be semiconducting and self-supporting after injection, and can have relatively low viscosity. The particle size of the powder used in the semiconductor ink can be very fine for precision ink dispensing, having a size of 10 microns or smaller.

Another exemplary embodiment of the present disclosure provides a process of manufacturing a 3D printing composition. The process can include melting the TPA at a temperature of at least about 140° C. in an enclosed container for at least about 15 minutes, adding one or more powders to the container and stirring for about two hours for homogeneity, reducing the temperature to about 100° C., applying a filament cap to the container, extruding a predefined length of a filament at a particular diameter, and cooling the filament into rolls for use in the 3D printing of electronic devices.

Initially the semiconductor ink is dispensed in a liquid suspension. Once the ink is dispensed from an injector it rapidly solidifies (cures) into a self-supporting mechanical structure. The ink can be pre-treated so that it remains wet enough after injection to seamlessly merge with previously deposited 3D-printed layers and adjacent material. The exemplary semiconductor ink can be printed at about room temperature so that significant thermal control is not necessary. Alternatively, semiconductor ink can be printed at various temperatures above or below the room temperature.

Second Embodiment Using UV Curable Liquid Epoxy

Liquid epoxy can affect the conductivity of the semiconductor ink, and may vary in various aspects of the present disclosure. The UV curing intensity and curing time can also affect the electrical properties of a semiconductor ink-based composition, and may vary in various aspects of the present disclosure.

An exemplary embodiment of the present disclosure is directed to a process of manufacturing an electronic device using ultraviolet (UV) curable liquid epoxy. The process can involve mixing UV curable liquid epoxy with at least one nanopowder to form a mixture, dispensing the mixture on a non-conducting glass surface, curing the dispensed mixture using an UV light emitting diode (LED) source, and melting the cured mixture to a semi-liquid state that is extruded from a print head to form the device. The LED source can have a maximum intensity of about 16 MW/cm2 and duration for the curing can be between about 20 seconds and about 120 seconds.

Another exemplary embodiment of the present disclosure is directed to a process of manufacturing an electronic device using TPA in combination with ultraviolet (UV) curable liquid epoxy. The process can involve mixing UV curable liquid epoxy with TPA and at least one nanopowder to form a mixture, dispensing the mixture on a non-conducting glass surface, curing the dispensed mixture using an UV light emitting diode (LED) source, and melting the cured mixture to a semi-liquid state that is extruded from a print head to form the device. The LED source can have a maximum intensity of about 16 MW/cm2 and duration for the curing can be between about 20 seconds and about 120 seconds.

Liquid epoxy is a staple material of the electronics industry, which has been widely employed in motors, generators, transformers, switchgear, bushings, and insulators. Most liquid epoxy specifies a long natural time or heat treatment for curing, which prevents liquid epoxies from being used as a 3D printing ink solution and binding agent. However, the fast UV curable liquid epoxy is an exception and has unexpected properties because it specifies a short curing time (usually seconds) under UV light activation. For example, fast UV curable liquid epoxy is a unique, one component, low viscosity, UV curable liquid adhesive that offers unexpected properties. The viscosity of such an epoxy is in the range of 200-450 cPs, which is suitable for ink-based material printing. Due to its excellent adhesion and fast curing property under UV light, a fast UV curable liquid epoxy is mixed with appropriate nanopowder materials to create the various basic electronic inks.

The process of forming semiconductor ink based materials for 3D printing involves mixing by fast blending action to evenly combine nanopowders and liquid epoxy whose viscosities differ. Before mixing, the liquid epoxy and selected nanopowders are measured precisely to the accuracy of about 0.001 gram to form an appropriate weight ratio. The mixture can be produced using a high speed centrifugal mixer in a short duration mixing process (generally about 60 seconds). The exemplary mixing device (e.g., mixer) can be a planetary centrifugal mixer having a mechanism in which the container holding the material revolves clockwise and the container itself rotates counter-clockwise. This planetary centrifugal mixer can mix materials gently without shearing, enabling even blending while maintaining the material's solid state properties. The exemplary mixing device can efficiently mix small amounts of nanopowders with liquid epoxy for repeated use.

Therefore, the process of making a semiconductor ink can include at least the following considerations: 1) the UV curable epoxy can behave like an electric insulator, therefore, modifications of the epoxy fluid are necessary; 2) the liquid semiconductor ink mixture should be cured completely to bring semiconductor particles in close contact; and 3) the IV curve measurement technique should be able to handle a thin layer of cured mixture without creating a short between voltage probes. The properties of a liquid epoxy can be modified by adding conducting silver nanopowder. This mixture results in a fast UV curable epoxy that can enable the epoxy to behave as an insulator and brings the semiconductor particles in close contact.

Applications

This technique for the 3D printing of functional electronics (3De) can have the capability to revolutionize the way electronics are designed, produced, and implemented throughout numerous fields of technology. For example, in long duration space transportation, the on-demand 3D printing of electronics becomes extremely important when electronic components fail and need to be replaced during flight. In addition, additive manufacturing applications can influence and benefit human-related systems or facilities operated temporarily or permanently in space such as Mars, and beyond.

Exemplary embodiments of the present disclosure are also directed to a printer, refillable material cartridges, control software, design software, and a membership driven user development community portal. In general, the system can enable a user design, layout, and print various 3D electronic circuits in a multitude of form factors, thus providing on demand, customized, production that meets the specific need at the specific time. The exemplary system and methods can be used in a variety of applications, for example, to form sensors and biomedical detectors, to perform circuit layout and design and, insitu production, for use as educational and training tools and in research and development, toys, games, enhanced electronic components, replacement parts, communications devices, computing equipment, household electronic components, industrial electronic components, over land electronic components, aerospace electronic components, nautical electronic components, sports equipment, construction equipment, robotic equipment, networking devices, Wi-Fi devices, Bluetooth devices, decorative components, lighting equipment, audio equipment, satellite components, spacecraft components, devices that utilize artificial intelligence, mobile devices, military equipment, wearable technology, devices utilizing Blockchain technology, devices utilizing finance, banking, and monitory technology, electronic jewelry, electronic time-keeping devices, internet of things (IoT) devices, or in any other application or implementation as desired.

The exemplary embodiments disclosed herein can be for nano-electronic materials development such that any raw material mixed under the exemplary processes described herein can be converted into a range of electronic inks to be deposited for the formation of 3D electronic components through the use of various 3D printing processes. The driving variable in how the resulting semiconductor based inks are then deposited is determined by their intended application and fluid viscosity ranges. Semiconductor inks that range from about 1 to 1,000 centipoise in viscosity are precisely deposited using 3D Aerosol Jet printing technology. When ink viscosities rise within ranges of about 1,000 to 10,000 centipoise then it is more desirable to move to higher viscosity pneumatic spraying or dispensing techniques.

Semiconductor materials can be deposited using spraying technologies where the materials can be held in a pressurized reservoir and delivered to a pneumatic spray head that is controlled through computer software to turn on and off to regulate the dispensing of the material. Spraying capabilities can provide a high volume deposition process for printing a wide variety of electronic coatings, adhesives, and resins to provide protective encapsulation and adhesion of parts to surfaces. When smaller fine feature deposits are desired, pneumatic dispensing of inks and thick film pastes provide for a more controlled direct write approach.

An exemplary embodiment of the present disclosure can provide a significant advantage over known printing techniques in applying thick film material development processes to manufacture a variety of electronic thick film devices by employing the practice of screen printing. Screen printing provides highly repeatable rapid planar printing of electronic circuitry for prototyping and proof of concept work in this area. It also allows for very high solids loading of electronic epoxies and pastes to be deposited in a multilayer fashion.

Another example of 3D printing of functional electronics (3De) is in-sole sensing devices that can be printed using three materials—conductive, capacitive, insulating. The sensing devices can be a matrix of pressure and temperature sensors made from isolated capacitive and conductive elements connected by conductive wires across a surface. The surface can be formed into any desired shape. In this case the shape of a foot is desired at various lengths and widths. Pressure can be sensed by the change in geometry of the sensor elements by pressure applied by the wearer. The geometry change can result in a capacitance change which can further cause a change in a voltage applied across the elements. A temperature can be sensed by a change in the resistivity of the conductive material when a significant change in temperature occurs. A voltage change can be created because of the change in resistance across the material.

Yet another example of 3D printing of functional electronics (3De) is a pressure sensor array that can be printed using a combination of an insulator mixture, a capacitive mixture, and conductive/low resistive mixture. The sensor array can be made of a lattice of individual capacitive elements connected on top and on the bottom by the conductive lines. It can be enclosed in an insulating housing in the shape of a foot sole. As pressure is applied to the array, the elements in the neighborhood of the pressure are deformed and thus their capacitance values are changed. These changes can be sensed by voltages at the connections.

Figure 17A:
FIG. 17A shows an exemplary helmet impact sensor that is conceptualized using a 3D printed capacitive pressure sensor array using a combination of capacitive, resistive, and insulating mixtures.
Figure 17B:
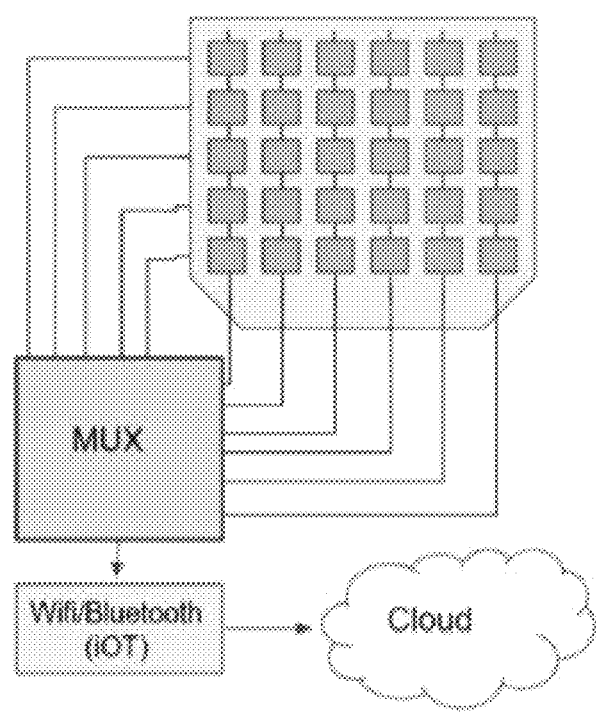
FIG. 17B shows an exemplary 3D printed capacitive pressure sensor array using a combination of capacitive, resistive, and insulating mixtures.

Yet another example of 3D printing of functional electronics (3De) is a football helmet impact sensor, as shown in FIG. 17A. The helmet impact sensor is conceptualized using a 3D printed capacitive pressure sensor array using a combination of capacitive, resistive, and insulating mixtures. Impacts on front, side, back or any localized area can be measured and uploaded to a server giving real-time, multiple player data on force and pressure.

Other applications include, for example, form sensors and biomedical detectors, to perform circuit layout and design and, insitu production, for use as educational and training tools and in research and development, toys, games, enhanced electronic components, replacement parts, communications devices, computing equipment or in any other application or implementation as desired.

Testing of Material Properties

Each material printed by a 3D printer has a specific electrical property specifying a desired behavior and desired use in complex electrical device dependent upon the geometry of that material.

For a conducting material, the conductivity, which is measured in mhos/meter (inverse of resistivity), should be high. The conductivity can be measured by producing a line of known geometry and measuring the total resistance. Conductance is the inverse of resistance.

For an insulating material, the resistivity, which can be measured in ohms/meter (inverse of conductivity), should be high. For a resistive material, the resistivity should vary from moderate to high. Resistivity can be measured by producing a line of known geometry and measuring the total resistance.

For a capacitive material, the relative dielectric constant (unit less) should be greater than 1. This dielectric constant is directly proportional to the amount of capacitance available in the structure. It can be measured by producing a sample of known geometry then passing a known sinusoidal signal of known frequency through it. The variation of the phase and the amplitude of the signal are functionally related to the capacitance.

For a semiconducting material, the material should act as a switch, changing its overall resistance depending upon the voltage applied across it, or the current flowing through it. At low voltages, the resistance is high, and at high voltages the resistance is low. The electrical response or behavior of the semiconducting material can be captured in the form of an IV curve, which typically has an exponential behavior as dependent upon applied voltage. Important measures are turn-on voltage and saturation current.

In addition to electrical properties the materials also have mechanical properties by virtue of their composition. Because the foundation of the composition is polymer based, they have stress/strain characteristics that are dependent upon them. Also, the melting points of the materials are also dependent largely upon the polymer base. Stress and strain are measures of how much deformity a material can stand before failure. There are classic stress/strain curves.

The current (I)-Voltage (V) characteristic curve (IV), defines the relationship between the current flowing through an electronic device and the applied voltage across its terminals. For a fixed value resistor, the IV curve is approximately a straight line. However, the IV curve for a semiconductor material is not linear. Starting from the zero applied voltage, the current value increases but the magnitude is extremely small. The current passing through semiconductor will increase rapidly for a small increment of voltage when the "kick-off" voltage reached.

Mixture Specifications

Table I below illustrates the exemplary base mixtures with approximate amounts for forming various 3D print electronics of the present disclosure. These are merely illustrative of the present disclosure and should not be construed as limiting the scope of the disclosure in any way as many variations and equivalents that are encompassed by the present disclosure will become apparent to those skilled in the art upon reading the present disclosure.

| Type | ABS | PLA | TPA | graphene | graphite | Ag | TiO2 | Si—N | Si—P | TiAl |
|---|---|---|---|---|---|---|---|---|---|---|
| Insulating | 1.00 | | | | | | | | | |
| Insulating | | 1.00 | | | | | | | | |
| Insulating | | | 1.00 | | | | | | | |
| Insulating | | 0.25 | 0.75 | | | | | | | |
| Conducting | | | | | | | | | | 1.00 |
| Conducting | | | 0.40 | 0.45 | | 0.15 | | | | |
| Resistive | 0.60 | | | | 0.30 | 0.10 | | | | |
| Resistive | | | 0.65 | | 0.25 | 0.10 | | | | |
| Resistive | | 0.25 | 0.45 | | 0.25 | 0.10 | | | | |
| Capacitive | | | 0.65 | | | | 0.35 | | | |
| Capacitive | | 0.30 | 0.35 | | | | 0.35 | | | |
| Semiconducting | | | 0.45 | | | 0.05 | | 0.50 | | |
| Semiconducting | | | 0.45 | | | 0.05 | | | 0.50 | |

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. A composition for use in 3D printing of electronic devices, comprising:
    at least Triphenylamine (TPA), wherein
    the TPA is in powder form and is used as a powder binding agent in the composition, and
    the composition is to be melted and extruded on a structure,
    wherein:
        the composition is insulating, and
        the TPA forms about 99% of the composition by weight.

2. A composition for use in 3D printing of electronic devices, comprising:
    at least Triphenylamine (TPA), wherein
    the TPA is in powder form and is used as a powder binding agent in the composition, and
    the composition is to be melted and extruded on a structure,
    wherein:
        the composition is insulating,
        Polylactide (PLA) forms about 25% of the composition by weight, and
        the TPA forms about 75% of the composition by weight.

3. A composition for use in 3D printing of electronic devices, comprising:
    at least Triphenylamine (TPA), wherein
    the TPA is in powder form and is used as a powder binding agent in the composition, and
    the composition is to be melted and extruded on a structure,
    wherein:
        the composition is capacitive,
        PLA forms at least about 30% of the composition by weight, and Titanium dioxide ($TiO_2$) forms at least about 35% of the composition by weight, and
        the $TiO_2$ is in a powder form with particle size ranging from about 100 nm to about 100,000 nm.

4. A composition for use in 3D printing of electronic devices, comprising:
    at least Triphenylamine (TPA), wherein
    the TPA is in powder form and is used as a powder binding agent in the composition, and
    the composition is to be melted and extruded on a structure,
    wherein:
        the composition is semiconducting,
        silver (Ag) forms at least about 5% of the composition by weight, and n-type Silicon semiconductor (Si—N) forms at least about 50% of the composition by weight, and
        the Si—N is in a wafer form with a particle size of about 100 um.

5. A composition for use in 3D printing of electronic devices, comprising:
    at least Triphenylamine (TPA), wherein
    the TPA is in powder form and is used as a powder binding agent in the composition, and the composition is to be melted and extruded on a structure, wherein:
the composition is semiconducting,
silver (Ag) forms at least about 5% of the composition by weight, and p-type Silicon semiconductor (Si—P) forms at least about 50% of the composition by weight, and
the Si—P is in a wafer form with a particle size of about 100 um.

* * * * *